United States Patent [19]

Armer

[11] 4,414,539
[45] Nov. 8, 1983

[54] BUILT-IN PASSIVE FAULT DETECTION CIRCUITRY FOR AN AIRCRAFT'S ELECTRICAL/ELECTRONIC SYSTEMS

[75] Inventor: James P. Armer, Bellevue, Wash.
[73] Assignee: The Boeing Company, Seattle, Wash.
[21] Appl. No.: 972,501
[22] Filed: Dec. 22, 1978
[51] Int. Cl.³ .......................................... G08B 23/00
[52] U.S. Cl. ................................... 340/500; 340/507; 340/510; 340/511; 340/514
[58] Field of Search ............... 340/500, 501, 506, 507, 340/509, 510, 511, 521, 522, 524, 27 R, 52 F, 514, 537, 650, 651, 652, 653, 657, 661

[56] References Cited

U.S. PATENT DOCUMENTS

| | | | |
|---|---|---|---|
| 3,588,890 | 6/1971 | Cox | 340/511 |
| 3,700,966 | 10/1972 | Morrow | 340/650 |
| 3,786,501 | 1/1974 | Marnerakis | 340/511 |
| 3,821,734 | 6/1974 | Herrliberg et al. | 340/510 |
| 3,973,257 | 8/1976 | Rowe | 340/511 |
| 4,007,456 | 2/1977 | Paige et al. | 340/507 |

OTHER PUBLICATIONS

"Proceedings of The National Aerospace Conference 1973"; Perkins et al.; 5-14-73; pp. 355-359.

Primary Examiner—Donnie L. Crosland
Attorney, Agent, or Firm—Christensen, O'Connor, Johnson & Kindness

[57] ABSTRACT

Built-in test equipment (BITE) of the electrical/electronic systems of an aircraft is provided in-part by passive fault detection circuitry that is integrated into the electrical/electronic systems for continuous, in flight monitoring of line replaceable units (LRUs), such as temperature and pressure sensors. Both steady and intermittent failures of the LRU components are detected, and the type and location of each failure is identified and stored in a memory for continuous display or for subsequent recall by ground maintenance crews. The primary feature of the disclosed circuitry is its ability to detect and distinguish between an open impedance fault of a critical LRU component and an open wiring fault in the interconnect wiring that is associated with each component and is needed to electrically communicate signals developed at remotely mounted sensor components with a centralized controller, usually located in the avionics bay. To enable such differentiation between these two most frequent kinds of faults, each system component that is to be monitored is provided with one or more shunts having predetermined impedance relationships with the associated component so that an open component failure, when detected through the interconnect wiring, appears as a measurably different electrical condition than an open failure of the interconnected wiring which leads to that component. The capability of distinguishing between open component and open wiring faults minimizes the frequency at which LRUs incorporating critical components are simply replaced, without remedying the malfunction.

9 Claims, 6 Drawing Figures

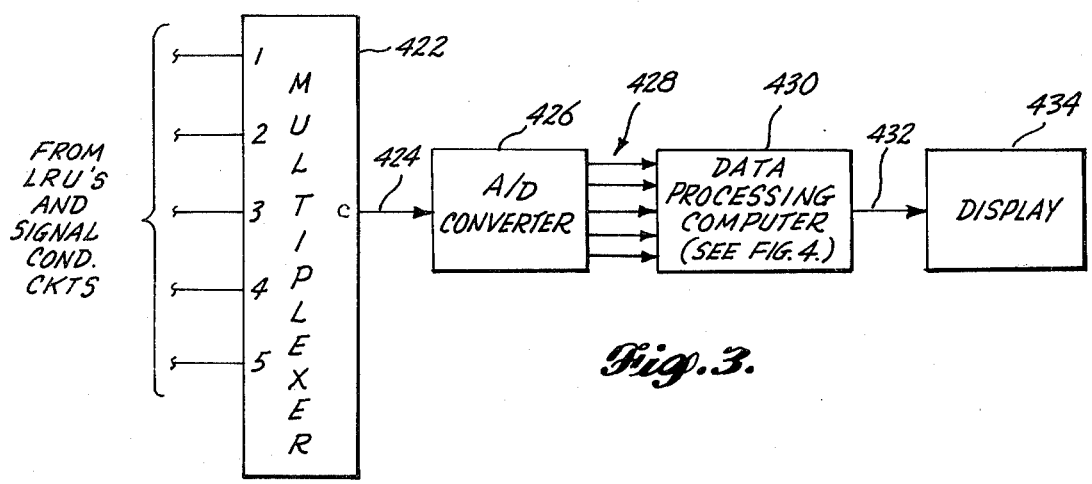
*Fig. 3.*
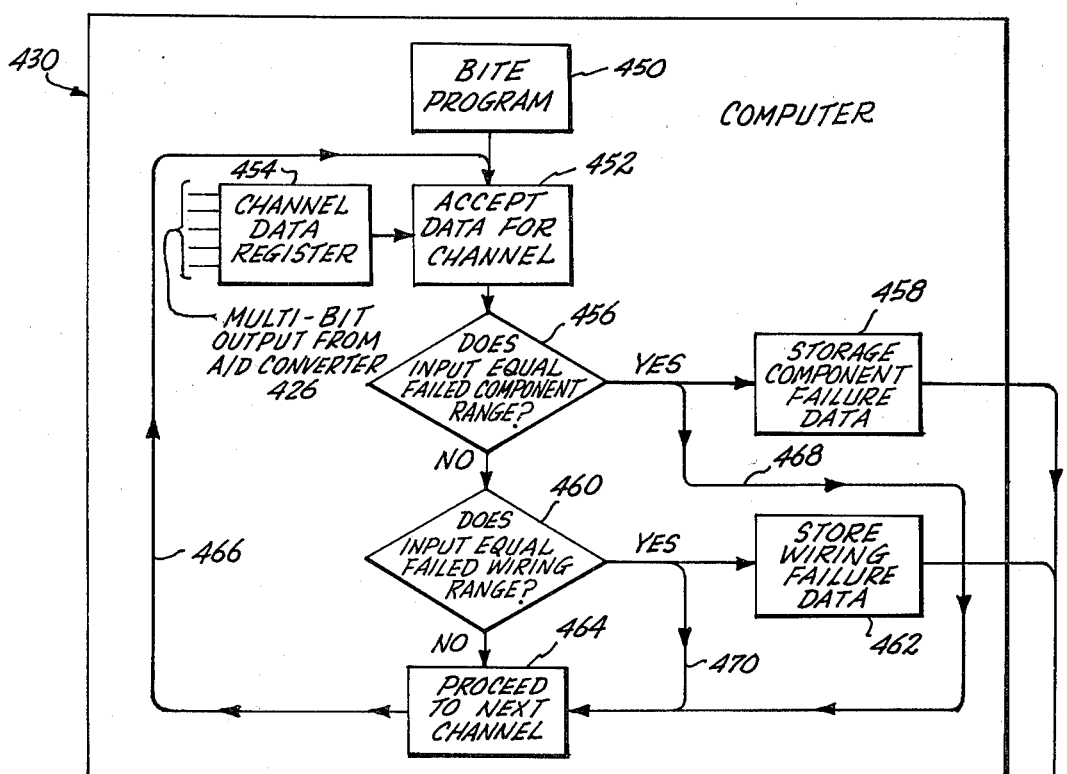
*Fig. 4.*
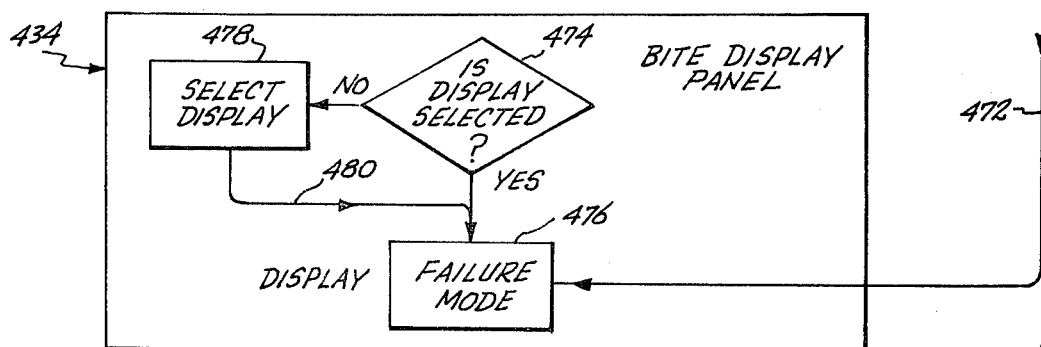

BUILT-IN PASSIVE FAULT DETECTION CIRCUITRY FOR AN AIRCRAFT'S ELECTRICAL/ELECTRONIC SYSTEMS

BACKGROUND OF THE INVENTION

The invention relates to built-in test equipment and more particularly to passive fault detection circuitry incorporated into the electrical/electronic systems of an aircraft for detecting and identifying electrical faults in the systems' components, including elements such as temperature sensors, pressure sensors, valve actuating solenoids, and the like.

The electrical/electronic systems of a modern, commercial aircraft are made up of a large number of line replaceable units (LRUs). Each LRU is mounted on the aircraft in a manner that allows removal and replacement by maintenance crews, and each unit is interconnected, via cable wiring, with controllers, usually located in a central equipment bay. Thus, when a malfunction develops in one of the electrical/electronic systems, the first step is to evaluate the nature of the malfunction and identify the type and location of the causal fault. The fault must be localized to a particular LRU, which can then be replaced in order to restore the aircraft to service. The fault may be located either by means of BITE or by an evaluation of the symptoms of the fault by the flight crew and/or technicians from the ground maintenance crew. Typically, each LRU will contain one or more discrete components, the condition of which is critical to the proper operation of the associated LRU. For example, an LRU forming part of the environmental control system may contain one or more temperature sensors of a variable, thermosensitive resistance type. Another LRU of the same system may comprise a pressure sensor of a variable inductance type. These are merely examples of a few of the numerous LRUs that collectively form the environmental control system. A fault in one of these temperature or pressure sensors, or other component, will necessitate the replacement of the associated LRU. Each of the other electrical/electronic systems of the aircraft is similarly organized into numerous and various LRUs.

One of the most frequent kinds of fault occurs when a discrete electrical component constituting an LRU becomes damaged in a way that causes such component to have an open impedance. This type of fault may be detected and located in one of several ways. If the fault is a steady one, then a ground crew technician will, either upon his own discovery of the fault, or in response to a complaint from the flight crew, check out the various possible reasons for the malfunction using ground test equipment. For example, the impedance of several possible malfunctioning LRUs may be checked by measuring the impedance across the interconnect wiring that extends to each LRU component. In many instances, the individual LRU components are not readily accessible, being located at diverse points throughout the aircraft such that they are not easily reached by the ground crew, and the impedance check is therefore usually performed by testing the electrical condition of the component as such impedance appears at one or more conveniently and centrally located terminals in the electrical/electronic equipment bay. Having localized the system failure to the circuitry of a remote LRU, the technician will then go to the location of the remote LRU in the wing, empennage, engine installation, wheel well or other appropriate body location. There he will remove access panels if required to get to the LRU, disconnect the wiring connector, and test continuity of the wire run from the equipment bay to the LRU as well as testing the internal continuity of the LRU through the mating plug.

Alternatively, BITE systems are available for automatically monitoring the impedance of the component and generating a fault indicating signal for alerting the maintenance crews to the existence and location of the fault. As in the case of the above described, initial manual impedance check, the BITE impedance measurement is also performed at the centrally located terminals.

In the past, the foregoing fault detection and locating techniques have not proved to be entirely successful in terms of providing quick, cost effective correction of electrical/electronic system faults. The drawbacks of such techniques are particularly acute in the case of intermittent faults, namely faults that occur intermittently during flight, but do not reoccur when the electrical/electronic systems are checked out by the technicians while the aircraft is on the ground. When the ground crew has been alerted to such an intermittent fault, a common practice is to replace the LRU to which the fault has been isolated, even though the fault does not reoccur during ground testing. Such replacement of the LRU is resorted to only after time-consuming testing of the system has failed to further identify and pinpoint the exact nature of the failure within the LRU, the corrective action taken by the ground crew in replacing the unit is effective.

However, in a significant number of cases, the intermittent fault, which cannot be made to reoccur on the ground, is due to a failure not within an LRU, but rather is due to an intermittent defect in the interconnect wiring including the associated connectors that extend between the terminals in the equipment bay (or other central location) and the component of the LRU. One common type of fault of this nature occurs when a wire, or more probably a pin and associated socket in a multipin connector that forms part of the interconnect wiring, has an intermittent open. With existing BITEs and existing fault detection techniques which monitor the LRU component through the interconnect wiring, an intermittent open condition in one of the interconnect wires appears as an open component fault and as a consequence, the usual attempt to correct the problem is to replace the associated LRU. Of course, the corrective action is wholly ineffective, and when the fault reoccurs during flight, the entire maintenance procedure must be repeated, resulting in a large number of ineffectual maintenance actions. Studies have shown that intermittent connector failures in the interconnect wiring, where the failure appears as an open component in an LRU, are the cause underlying a majority of ineffective maintenance actions.

The frequency at which this type of intermittent fault occurs, is related, among other things, to the age of the aircraft, to the cable length over which the interconnect wiring is extended, and to the number of connectors that are used along any given run of cable. In some cases the interconnect wiring is extended to 100 feet or more. Also, numerous connectors are required in many cable runs for joining sections of cable that pass through partitions and other interior obstructions such as firewalls, and at joints between structural sections of the aircraft body, such as where a wing or other appendage joins the fuselage. As a result, some interconnect wiring, due to its length and number of intervening connectors, is prone to the type of open fault that is referred to above.

Although the foregoing maintenance problem is known to commercial airlines as well as aircraft manufacturers, a satisfactory solution has not been previously proposed. As mentioned, numerous BITE systems are available, however none have the capability of distinguishing faults in the interconnect wiring from faults in the LRU components, particularly where the components are of the type that are prone to open circuit faults, such as temperature and pressure sensors and the like. Components such as these are characterized by an impedance, lying somewhere between zero and infinity (open circuit) and the instantaneous impedance varies as a function of the parameter that is to be sensed.

One known BITE system that is pertinent to the present invention, is described in an article by J. R. Perkins, H. W. Heinzman and W. T. Turnage, "Proceedings of the National Aerospace Electronics Conference," 1973 record pages 355–359. In that article, a BITE system is disclosed in which a resistive impedance network is employed in conjunction with a switch signal source to enable the BITE to distinguish between an open wire fault and an open condition of the switch, and between a shorted interconnect wire and a closed condition of the same switch. However, it is noted that this known BITE system does not attempt (and is not capable of) detecting and distinguishing an electrical fault of the switch component (such as a stuck open failure of the switch) as well as a fault in the wiring. Also, this known BITE is employed in conjunction with a switch component that has discrete, open and closed impedance conditions of infinity and zero, respectively, and does not contemplate the use of fault prone components having predetermined intermediate impedance values or a range of continuously variable impedance levels, such as the above referred to discrete sensor components of certain LRUs.

Other heretofore proposed BITE systems require the use of active circuit elements directly in conjunction with the discrete component that is to be monitored. By active elements, it is meant that the fault detection of the BITE requires the injection of a separate voltage or current test signal that is independent of a control signal which is present as normal operating condition of the monitored component. Such active circuit BITE systems are less desirable than a passive BITE system, the latter of which uses the same voltage and/or current control signal that occurs normally during operation of the components that are being monitored. Thus a passive BITE circuit, as the term is used herein, does not require an additional, external electrical signal source that would add undue complexity and additional circuit elements that are themselves subject to possible malfunction.

Accordingly, it is an object of the invention to provide improved, passive fault detection circuitry for the electrical/electronic systems of an aircraft that remotely monitors the condition of individual, discrete elements of LRU components, such as temperature sensors, pressure sensors, valve solenoids and the like, by sensing operating signals associated with these elements as such signals appear at readily accessible terminals (such as in the electrical/electronic equipment bay), that are connected to the LRU components by interconnect wiring, and wherein the detection circuitry has the capability of distinguishing an open impedance fault of the component from an open impedance fault of the associated interconnect wiring.

Another object of the invention is to integrate such passive fault detection circuitry into the aircraft's electrical/electronic systems in a manner that enables the circuitry to monitor the condition of the discrete LRU components and associated interconnect wiring, at all times during their operation in the electrical system, so that intermittent faults, as well as steady faults, are detected during the flight. A related object is to provide as part of the fault detection circuitry, memory capability for storing the occurrence, location and nature of detected component and/or wiring faults so that intermittent faults are detected and their occurrence stored.

An additional object of the invention is to provide passive fault detection circuitry for the electrical/electronic systems of an aircraft, which has the foregoing capabilities, and which is cost effective in terms of the cost savings involved in eliminating unnecessary or ineffectual maintenance actions as compared to the cost of implementation and overall reliability and maintenance of the fault detection circuitry itself.

SUMMARY OF THE INVENTION

According to one of the principles of the invention, each of a plurality of discrete electrical components, that have been identified as critical to the proper operation of an associated LRU in the system, and that are mounted at diverse and remote locations on the aircraft, have one or more impedance elements connected thereacross as a test shunt. The impedance levels of the various test shunts are selected so as to be at least equal to that of the associated component, but substantially less than the open wire impedance of the associated interconnect wiring so that when the electrical condition of the component is monitored through the interconnect wiring, the impedance of an open LRU component fault appears as a measurably different electrical condition than an open fault in the interconnect wiring. Within the above defined impedance range, the minimum value selected for each test shunt must be such that only slight, and tolerable degredation occurs in the performance of the monitored LRU component. The maximum value of the shunt within the defined range is selected so that a measurable difference occurs in the impedance as monitored through the associated interconnect wiring, between an open component fault and an open wiring fault. The monitoring of the components is effected at accessible, centralized terminals at which the ends of the interconnect wiring remote from the components are terminated. To detect the different electrical conditions associated with the open component and open wiring faults, the associated signals are multiplexed into a common detector means that detects the presence of and identifies the type of fault.

In a preferred form of the invention, the various wiring terminals are correlated on a one-to-one basis with the associated components and memory means are provided for responsively storing the identity (location) and type of detected fault. This information may be subsequently retrieved for use during corrective maintenance. Intermittent faults that occur during flight are detected and stored in this manner so that subsequently, the ground crew is provided with complete fault diagnostic information, adequate for quick and effective correction of the fault in the component or associated terminal-to-component wiring.

In one embodiment of the above described preferred form of the invention, the detection means is a specially designed detection circuit and the output from such circuit is demultiplexed into a plurality of memories, one for each terminal set. The demultiplexer directs the fault detection output to the proper memory where the information is held until the memory is reset.

In another embodiment of the invention, the functions of the detector means and the memory means are performed by a programmed, general purpose computer. In such case, the output of the multiplexer is digitally encoded. This digitized signal, representing the electrical condition at each given wiring terminal is processed by a computer which compares the digitized value of the monitored condition signal, at each terminal, with reference data stored in the computer. The computer looks for predetermined relationships between the digitized value and the stored data. Deviations from such relationships indicate the occurrence, type and location of faults, and this information is stored in the computer memory.

To provide a complete disclosure of the invention, reference is made to the appended drawings and following description of certain particular and preferred embodiments.

BRIEF DESCRIPTION OF THE DRAWINGS

FIG. 3 is a partial block diagram, shown in generalized form, of another embodiment of the fault detection circuitry of the invention, using a programmed general purpose computer to perform the fault detection and locating functions that are performed by specially designed circuitry in the embodiment of FIG. 1.

FIG. 4 is a flow chart of the algorithm according to which the computer of FIG. 3 is programmed.

DETAILED DESCRIPTION

Figure 1:
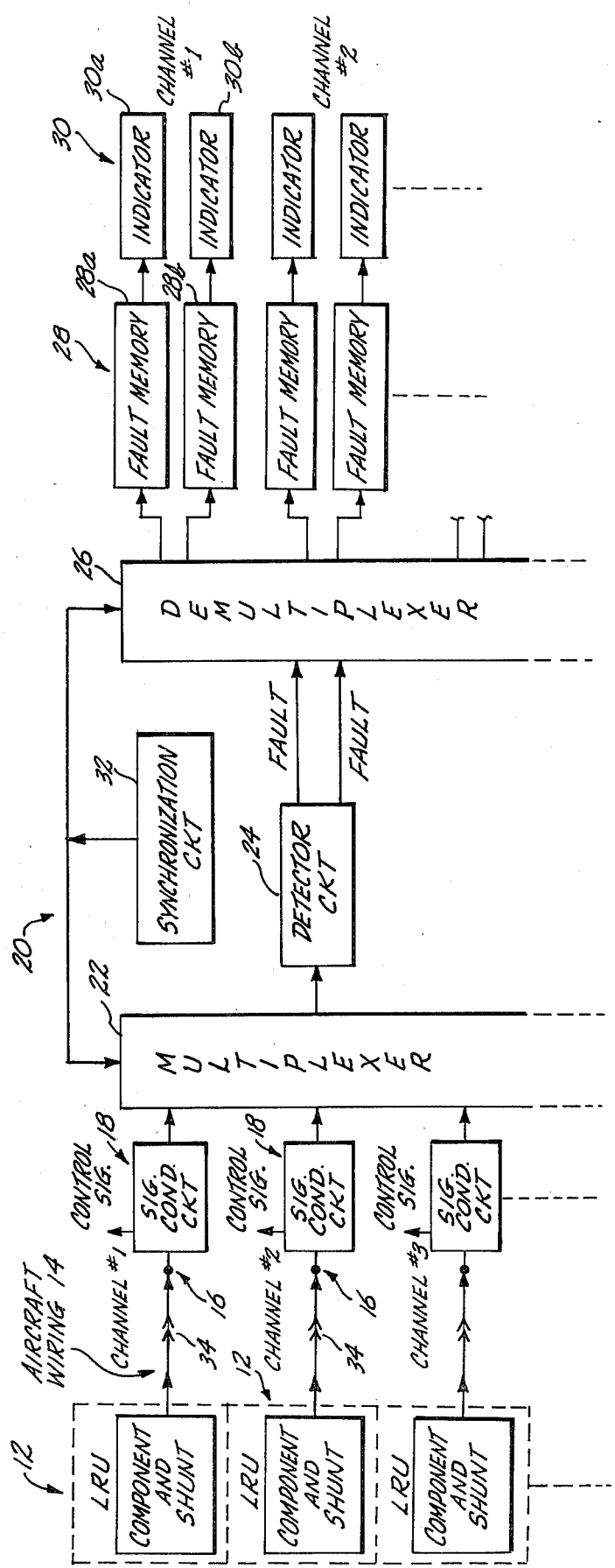
FIG. 1 is a generalized block diagram of the built-in, passive fault detection circuitry for an aircraft's electrical/electronic systems.

Shown in FIG. 1 is the portion of an aircraft's electrical system in which a plurality of line replaceable units (LRUs) 12 generate and/or receive control signals that are critical to the proper operation of the associated system. LRUs 12 are mounted at diverse locations throughout the aircraft and the corresponding control signals are fed to and from the LRUs over aircraft interconnect wiring 14 that extends between each LRU 12 and an associated terminal 16. The various terminals 16 are arranged in groups according to the functions of the corresponding LRUs 12, and are located at certain central, relatively accessible locations on the aircraft, such as in the electrical/electronic bay, for ease in servicing the electrical system. Usually, control signals that are to be sent to or received from an LRU 12 are modified by signal conditioning circuits 18, one for each terminal 16, and through these various conditioning circuits 18, the associated control signals are directed to or received from the controllers (not shown) that constitute the remaining sections of the aircraft's electrical system (not shown).

The components of LRUs 12 are monitored over separate channels, such as illustrated in FIG. 1 by channels #1, #2 and #3. To achieve such monitoring, passive fault detection circuitry is integrated into the electrical system formed by LRUs 12, wiring 14, terminals 16 and signal conditioning circuits 18, and includes the addition of test shunts, (as described herein at least one such shunt is connected across each LRU component) and circuitry 20 for multiplexing, detecting, identifying, storing and indicating faults that do occur in LRUs 12 and aircraft wiring 14.

For each component of an LRU 12, the impedance of the associated test shunt is selected so that an open impedance failure of the component will cause a different electrical condition at the associated terminal 16 than an open circuit failure of the corresponding leads of aircraft wiring 14. Circuitry 20, which operates in conjunction with the LRU component and its test shunt, includes a multiplexer 22 for multiplexing the test signals from the plurality of LRU channel #1, #2, #3, etc. into a common input to a detector circuit 24. Each of the multiplexed test signals is compared, one at a time, by detector circuit 24 with preestablished reference signals that represent acceptable limits of the electrical conditions of the shunted components and associated wiring. Component fault and wiring fault output signals are developed by detector circuit 24 when the multiplexed test signal falls outside limits preestablished by circuit 24, and these fault signals are hence fed through a demultiplexer 26 to a plurality of memory and indicator units 28 and 30, respectively. Each of channels #1, #2, #3, etc. has both a wire fault memory 28a and a component fault memory 28b which respectively receive and store the wiring fault and component fault signals developed at the output of demultiplexer 26. Similarly, each channel, as illustrated by channel #1, includes a wiring fault indicator 30a and a component fault indicator 30b, which are respectively coupled to the associated memory units 28a and 28b for receiving and indicating fault conditions stored in memory units 28. A synchronization circuit 32, such as a clock pulse generator, is jointly connected to multiplexer 22 and demultiplexer 26 to synchronize the multiplexing and demultiplexing functions.

As previously mentioned, each LRU 12 is a modular unit that contains one or more critical, electrical components. Once a fault has been localized to a certain LRU 12, then that unit is removed and replaced with a new unit, and the defective one is taken to the shop for repair or disposal. In testing the operability of each LRU 12, one or more electrical components within each unit is individually monitored. In many cases this is simplified by the fact that many LRUs have only one principal component, such as a pressure or temperature sensor.

Because LRUs 12 are mounted at diverse points on the aircraft, and are not easily accessible, particularly under the conditions that exist during the checking over or servicing of the aircraft by a ground crew between flights, it is desirable to carry out the electrical test of LRUs 12 over the aircraft's interconnect wiring 14. In one respect this simplifies the requirements of the BITE because the testing for faults can be carried out at one or more central, easily accessed terminals, such as in the aircraft's electrical/electronic equipment bay, to which the wiring 14 is routed.

On the other hand, testing of the remotely mounted LRUs 12 at the centrally located terminals 16 creates new testing problems. One of these, to which the present invention is directed is the frequent occurrence of faults within the aircraft interconnect wiring 14, that mistakenly appear, at terminals 16, as an electrical fault within LRUs 12. For example, one common complaint of aircraft maintenance personnel is that an open circuit fault in wiring 14 appears, when tested at a terminal 16, as an open circuit fault of the monitored component of the associated LRU 12. This condition occurs with increasing frequency where the cables that carry wiring 14 between the various LRUs 12 and the centrally located terminals 16, include one or more multipin connectors, which are schematically shown in FIG. 1 at reference numerals 34. One such connector 34 is normally provided at the LRU for convenience in removal and replacement thereof. Additionally, component-to-terminal interconnect wiring 14 that passes through partitions within the fuselage and wings of the aircraft, such as firewalls, bulkheads, or through other internal structures, such as joints between the fuselage and appendages of the aircraft, are normally provided with connectors 34, one at each such physical barrier. These connectors 34 facilitate the repair of the aircraft, for example, if it is necessary to replace a wing or other body appendage. Also, connectors 34 facilitate repair of the cable itself, by allowing for the replacement of only a certain section or sections of the cable rather than replacement of the entire reach of the cable.

However, the provision of connectors 34 increases the likelihood of intermittent, as compared to steady, open circuit faults in wiring 14. Intermittent faults compound the problem of identifying and locating the nature of a malfunction. For example, an intermittent fault that occurs while airborne, and does not repeat when on the ground, may be wrongly diagnosed as an intermittent fault of the LRU.

Also, multipin connectors 34 are subject to substantial wear over the lifetime of the aircraft because the LRUs 12 are frequently removed for testing, each removal and reinstallation requiring the use of one or more of the associated connectors 34. The sockets are permanently incorporated in the airplane wiring. The cooperating pins are provided on the LRU mounted half of the connector. The sockets may see four or five connects and disconnects per intermittent fault as several LRUs are tried at the location. The socket therefore sees five times the wear received by the LRU connector pin. The socket spring tension actually maintains the socket to pin contact, and this begins to weaken with all the flexing caused by the multiple LRU connects and disconnects. Eventually, the sockets of connectors 34 become worn to an extent that increases the likelihood of steady, but especially intermittent, open circuit faults at the pin-to-socket junctions.

Figure 2A:
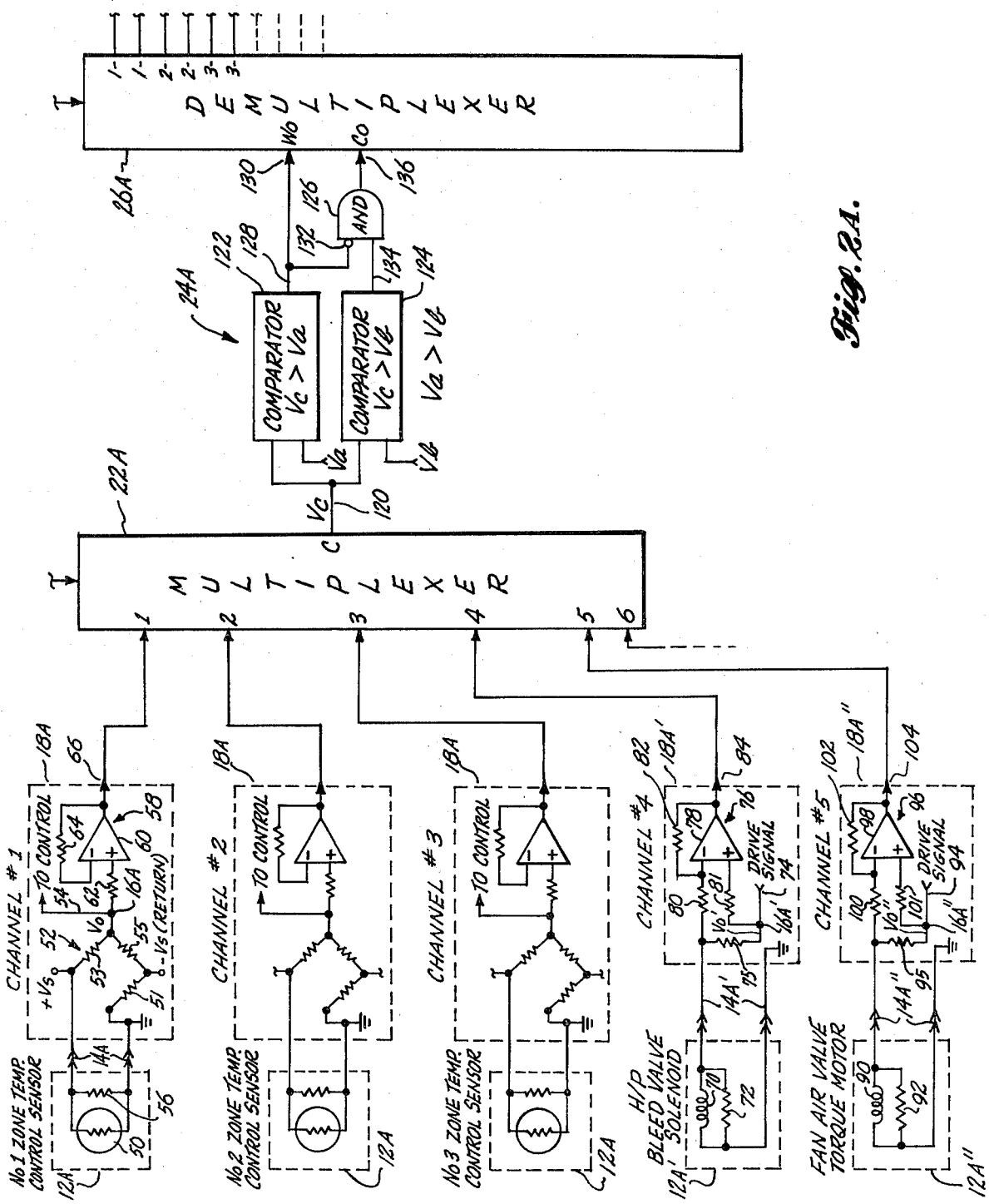
FIGS. 2A through 2C are composite schematic and block diagrams of particular, exemplary embodiments of the fault detection circuitry shown more generally in FIG. 1.

FIG. 2A illustrates how the principles described above and shown generally in FIG. 1 are applied to a particular set of LRUs 12A, 12A' and 12A''. LRUs 12A in FIG. 2A comprise a set of three cabin zone temperature control sensors, one for each of channel #1, #2 and #3. LRU 12A' is a solenoid for operating a high pressure bleed valve, and LRU 12A'' incorporates a torque motor for actuating a fan air valve of the bleed air systems. Considering each of these LRUs in detail, reference is made first to channel #1. LRU 12A of channel #1 includes a thermosensitive resistance 50 which serves as the active element of a temperature sensor and forms the critical component of the LRU 12A. As the impedance of resistance 50 varies with temperature, a temperature dependent control signal is developed at terminal 16A, with respect to ground as a result of variations in the output of a resistive bridge network 52, including resistors 51, 53 and 55. Resistance 50 is connected by the leads of aircraft wiring 14A as one branch of network 52. A steady DC supply voltage is applied to the input of bridge network 52 as indicated by $+V_s$ and $-V_s$. The temperature control signal developed by resistance 50 and the bridge network 52 of network 18A is passed on to a controller (not shown) of the aircraft's electrical control system over a lead 54 extending from terminal 16A.

A resistor 56 connected across temperature sensitive resistance 50 serves as the test shunt. The impedance of resistor 56 is selected according to a formula described below, so as to have a predetermined impedance relationship with resistance 50. Since resistance 50 will vary over a predetermined range, while resistor 50 is in this instance fixed, the ratio is specified, in part, with respect to the limits of the range of impedance values of resistance 50.

With the addition of the test shunt resistor 56, the voltage signal that appears at terminal 16A serves not only as a control signal over lead 54, but also as a test signal. An operational amplifier scaling circuit 58 including operational amplifier 60; input resistor 62 and feedback resistor 64 adjusts the level of the test voltage at terminal 16A so that the test voltage at an output 66 of circuit 18A is normalized with respect to the output test voltages from each of the other signal conditioning circuits 18A, 18A' and 18A'' so that all of these output test signals can be channeled by multiplexer 22A into a common comparator circuit 24A.

Channels #2 and #3 each have an LRU 12A and a signal conditioning circuit 18A that are schematically identical to channel #1, although the impedance values of the components may differ from those of channel #1.

A high pressure bleed valve solenoid of LRU 12A' includes the solenoid coil 70 and an associated test shunt in the form of resistor 72. Aircraft wiring 14A' connects coil 70 to signal conditioning circuit 18A' which includes terminal 16A'. The current for operating solenoid coil 70 is applied to terminal 16A' in the form of a drive signal applied at lead 74 and originating in a controller of the aircraft's electrical control system (not shown here). The current applied at lead 74 passes through current sensing resistor 75 and then through the parallel connection of coil 70 and resistor 72, developing a voltage drop $V_{o'}$ across resistor 75 at terminal 16A' which constitutes the test signal. A scaling circuit 76 provided by operational amplifier 78, input resistors 80 and 81 and feedback resistor 82 normalizes the level of the test signal at output 84, in the manner and for the purpose described above in connection with output 66 for channel #1.

LRU 12A'' of channel #5 is similar to the above described LRU 12A', except that the coil 90 in LRU 12A'' is that of a torque motor for operating a fan air valve. Connected across the motor coil 90 is a test shunt provided by resistor 92, and these paralleled elements are connected via leads of the aircraft interconnect wiring 14A'' to the signal conditioning circuit 18A'' of channel #5. As described above for circuit 18A', the channel #5 signal conditioning circuit 18A'' includes a terminal 16A'' and a current sensing resistor 95 through which a current drive signal is applied over lead 94, and the resulting test voltage $V_o''$ developed at terminal 16A'' is normalized by means of a scaling circuit 96 which includes operational amplifier 98, input resistors 100 and 101 and feedback resistor 102, and appears at output 104. The normalized test signals developed at the outputs of signal conditioning circuits 18A, 18A' and 18A" for each of channel #1-5 are received at the separate inputs of multiplexer 22A which successively applies each input to a common output 120, shown as test voltage signal $V_c$. The output 120 of multiplexer 22A is in turn connected to the input of detector circuit 24A which includes a pair of comparators 122 and 124 and an AND gate 126. One of the inputs of each of comparators 122 and 124 is jointly connected to output 120 to receive the multiplexed test voltage signal $V_c$. The second input of comparator 122 receives a reference voltage $V_a$ and the second input of comparator 124 receives another reference voltage $V_b$, where $V_a$ is greater than $V_b$. An output 128 of comparator 122 is connected to a first input 130 of the demultiplexer 26A, and represents a wire open fault. The output 128 is also connected to an inverted input 132 of AND gate 126. Output 134 of comparator 124 is connected to the remaining input of AND gate 126, and the output of AND gate 126 is in turn connected to a second input 136 of demultiplexer 26A, representing a component open fault.

The reference voltages $V_a$ and $V_b$ are selected to define voltage limits with respect to which the multiplexed test voltage $V_c$ is compared to enable circuit 24A to detect the presence of a fault in any one of channel #1-5, and determine whether the detected fault is caused by an open wire condition or by an open component condition. In general, the threshold levels of responsiveness of comparators 122 and 124 (i.e., the levels of reference voltages $V_a$ and $V_b$) are selected so that the test voltage $V_c$ is greater than $V_a$ when the terminal-to-component wiring of the associated channel is open, e.g., the aircraft wiring 14A in channel #1 becomes open; and so that the test voltage $V_c$ is less than $V_a$ and greater than $V_b$ when the component of the associated channel has an open impedance fault, e.g., thermosensitive resistance 50 of channel #1 becomes open. By selecting the values of the various shunt impedances relative to the associated component impedances, and designing the amplification factors of the various scaling circuits within the signal conditioning circuits 18A, each channel will produce a test voltage $V_c$ that exceeds the preestablished reference voltage $V_a$ when the aircraft wiring to the component is open, and that lies between $V_a$ and the preestablished reference voltage $V_b$ when the impedance component of the LRU falls open.

In particular, it is necessary to select the values of the shunt impedances, such as shunt resistance 56 of channel #1's LRU 12A so that the impedance of the shunt is not so low relative to the impedance of the aircraft's LRU component, in this instance being resistance 50, that the component is excessively attenuated and is prevented from functioning properly in the avionics. At the other extreme, the value of the shunt impedance cannot be so large relative to the impedance of the associated terminal-to-component wiring 144, that an insufficient differential in the test voltage $V_c$ occurs between an open wire fault and an open component fault. As a result of this latter constraint, it is necessary to restrict the LRU components to a maximum impedance of 1 megohms. Any component impedance in excess of this amount may appear too much like an open wire fault to detection circuit 24A, thereby resulting in unreliable operation of the fault detection circuitry.

As an example of the application of these constraints to LRU 12A and signal conditioning circuit 18A of channel #1, and detection circuit 24A, the following computatons are carried out to establish the values of reference voltages $V_a$ and $V_b$ at comparators 122 and 124. It is assumed that the value r of thermosensitive resistance 50 ranges from a low of r=1,200 ohms to a maximum of r=1,373.2 ohms typical values for a platinum wire temperature sensor. The maximum value of r is used to compute the optimum shunt impedance r'. In this particular type of network, a factor of ten times the maximum impedance of the component is used to set the value of the shunt impedance. Thus, r' is set at 14,000 ohms. Since this value is well within the maximum limit of 1 megohms it meets the second of the above mentioned constraints. The combined or parallel impedance of resistance 50 and shunt resistor 56 equals 875.1 ohms. The value of resistor 51 of bridge network 52 is selected to equal this maximum parallel impedance so that the voltage across the output of the bridge varies as resistance 50 deviates from the null point of the bridge. With $V_s$ equal to 10 volts across the bridge ($-V_s$ is the negative terminal of a supply voltage $V_s=10$ volts), the output voltage $V_o$ between ground and terminal 16A can be calculated to vary as follows:

| Condition | Output Voltage: $V_o$ |
| --- | --- |
| Normal | −1.87 to +0.88 volts |
| Component open | +4.4 |
| Wiring open | +5 |

Output voltage $V_o$ is normalized by scaling a circuit 58 to vary between 0 and 10 volts as $V_o$ ranges from −5 to +5 volts. The threshold levels of responsiveness of comparator 122 and comparator 124 are set respectively at $V_a=9.5$ volts (corresponding to $V_o=4.7$ volts) and $V_b=6$ volts (corresponding to $V_o=3$ volts). Thus, so long as $V_c$ remains below 6 volts, no fault is sensed by detector 24A. If the voltage $V_c$ at any output channel rises above 6 volts, but below 9.5 volts, then comparator 124 and AND gate 126 responsively cause a component open signal to be developed at output 136 which is demultiplexed into the associated memory 28 and indicator 30 shown in connection with FIG. 1. If $V_c$ rises above 9.5 volts then comparator 122 responds and causes a wire open signal to issue at output 130 which again is routed by demultiplexer 26A to the proper memory and indicator.

In a similar fashion, the impedance values for the shunt resistors of LRUs 12A for channels #2 and #3 are selected, whereafter the associated scaling networks are designed to normalize the output voltage levels to $V_c$ for processing by the common detector circuit 24A. In the illustrated example, channels #1-3 are substantially identical and the impedance ranges of each of the thermosensitive resistances of channels #2 and #3 are identical or almost identical to that of resistance 50 of LRU 12A in channel #1. Accordingly, there is little difficulty in selecting the values of the various shunt impedances and scaling networks for developing the normalized test voltage signal $V_c$ for these first three channels.

However, in channels #4 and #5, the critical LRU components are a solenoid coil 70 and a torque motor coil 90, respectively. In these instances, the values of the associated shunt resistor 72 and 92 need be selected so that the ratio of the voltages $V_o'$ and $V_o''$ between the threshold wire open and threshold component open values are equal to the ratio of the corresponding levels of the above described $V_o$ for channel #1.

Accordingly, in selecting the values of resistances 72 and 92, not only must these values meet the constraints of being sufficiently large in impedance so as to not excessively attenuate or dampen the performance of the associated component, i.e., coils 70 and 90 respectively, but also the ratio of wire open-to-component open voltages at terminals 16A′ and 16A″ should equal the corresponding ratios of voltage levels of $V_o$ at terminal 16A as described above for channel #1. Thus, for example, the voltage $V_o'$ at terminal 16A′ of channel #4 for an open fault of wiring 14A′ should bear the same ratio to the voltage level of $V_o'$ for an open fault of coil 70, as the ratio of open wire-to-open component fault voltages of $V_o$ at terminal 16A in channel #1. By matching the open wire-to-open component fault ratios at each of the terminals 16A, 16A′ and 16A″, linear gain scaling networks 58, 76 and 96 are capable of normalizing the output test voltages that are fed to the plurality of inputs of multiplexer 22A, and that appear, in succession, as common test voltage $V_c$ at the input to detector circuit 24A.

Figure 2B:
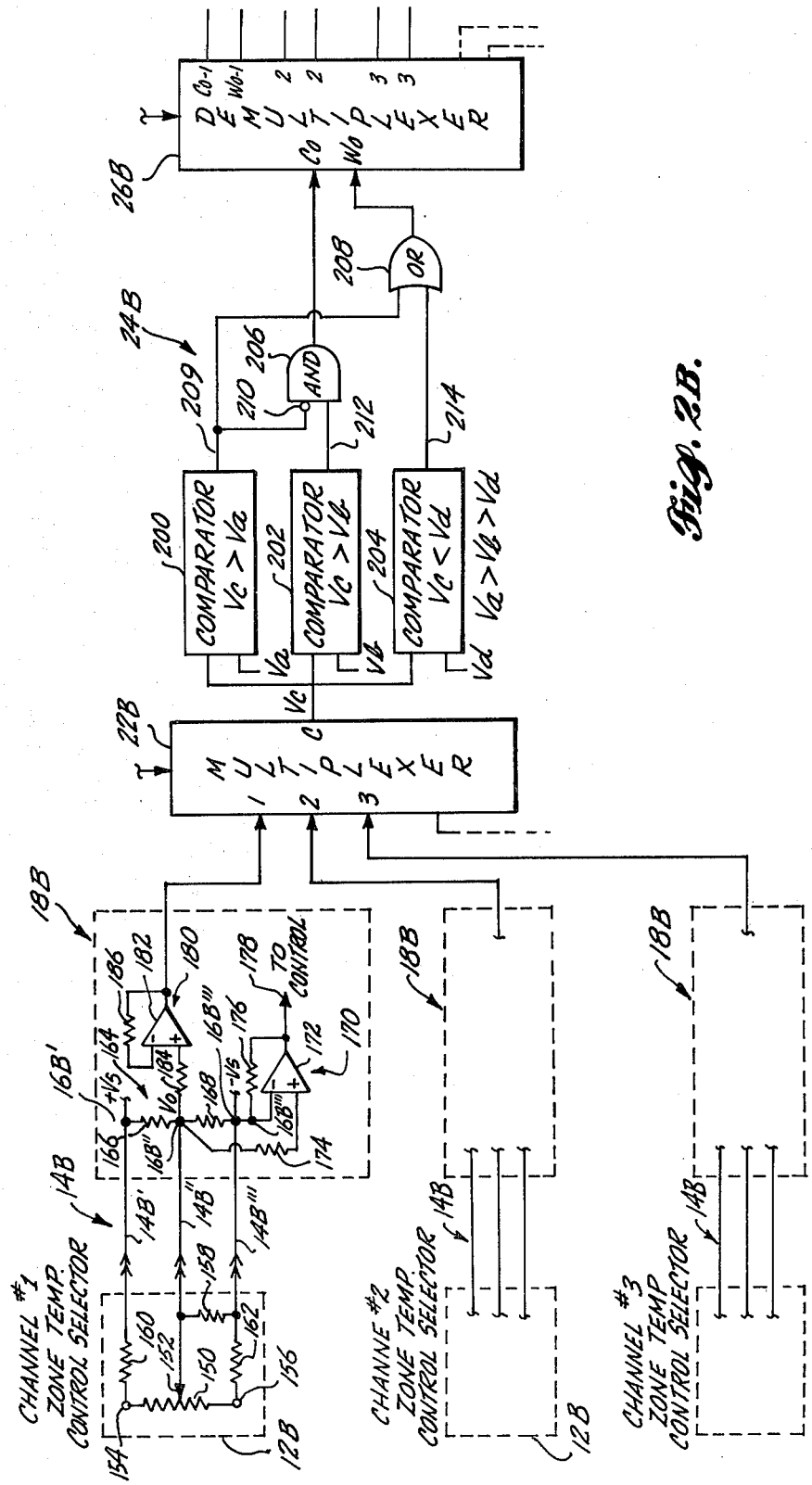

FIG. 2B illustrates an example of how the invention may be used to monitor the condition of a plurality of special, but identical LRU components 12B, using a common detector circuit 24B that has been specifically designed for such special components. In contrast to the exemplary circuit shown in FIG. 2A, and described above, LRUs 12B in the circuit of FIG. 2B each include a potentiometer functioning as a zone temperature control selector, and the associated aircraft interconnect wiring 14B for each of channels #1, #2 and #3 etc., consists of three leads, necessitating a specially designed detector circuit 24B, rather than the more universal detector circuit 24A of FIG. 2A.

In the circuit of FIG. 2B, as well as in other applications of the invention, the special LRU components used in an electrical/electronic system cannot be monitored by a universal detector circuit as in the case of circuit 24A of FIG. 2A. Rather, it is necessary to segregate different types or classes of special LRUs into separate groups. Each such segregated group can be used with a common compatible detector circuit, such as circuit 24B. The fault indicating outputs from the various demultiplexers of such circuitry may then be channeled to a consolidated bank of fault memories and indicators which store and display the faults from all of the various types of LRUs, irrespective of the LRU group from which the fault originated.

Thus, in FIG. 2B, all of the zone temperature control selectors for an environmental control system of the aircraft have been grouped and are shown as the selectors for channel #1-3, each being a separate line replaceable unit designated as LRUs 12B. With reference to LRU 12B for channel #1, the selector is provided by a potentiometer 150, including a wiper 152 and end terminals 154 and 156. The shunt impedance is provided by a resistor 158 which, because of the three wire configuration of the LRU, is supplemented by serial test resistors 160 and 162. Resistor 160 is connected in series between the upper lead 14B′ of the interconnect wiring 14B and the upper terminal 154 of potentiometer 150, and resistor 162 is connected in series with the lower lead 14B‴ and the other end terminal 156 of potentiometer 150. Shunt resistor 158 is in turn connected in shunt across the serial resistance of the lower half of potentiometer 150 and test resistor 162, and in particular, has an upper end connected to the junction between wiper 152 and center lead 14B″, and has the lower end connected to the junction between resistor 162 and the lower lead 14B‴ of the interconnect wiring. The addition of resistors 160 and 162 together with the shunt resistor 158 enable detector circuit 24b to identify wiring faults in each of the three leads 14B′, 14B″ and 14B‴ and to differentiate between an open wire fault and an open component fault. An open component fault in this case may occur either in the potentiometer resistance between end terminals 154 and 156, or in an open fault at wiper 152.

At the remote end of the interconnect wiring 14B from LRU 12B of channel #1, wiring leads 14B′, 14B″ and 14B‴ are terminated at a set of three terminals 16B′, 16B″ and 16B‴, at signal conditioning circuit 18B, where these terminals collectively correspond to the single terminal 16 shown in the generalized block diagram of FIG. 1. A voltage divider network 164 is connected across the leads at terminals 16B′, 16B″ and 16B‴, and includes a first resistor 166 connected between terminals 16B′ and 16B″, and a second resistor 168 connected between terminals 16B″ and 16B‴. Network 164 cofunctions with shunt resistor 158 and resistors 160 and 162 to cause a voltage signal $V_o$ to be developed at terminal 16B″, where $V_o$ is subsequently monitored to detect the occurrence and type of fault. The control signal associated with potentiometer 150 is also derived from $V_o$ and for this purpose, $V_o$ is applied to a buffer circuit 170 including an operational amplifier 172, an input resistor 174 and a feedback resistor 176, and the control signal is developed at output 178 of buffer circuit 170 and is extended to a controller (not shown) in the aircraft's electrical control system.

As a test voltage, signal $V_o$ is applied through a scaling network 180 to the channel #1 input of multiplexer 22B, where network 180 includes an operational amplifier 182, an input resistor 184 and a feedback resistor 186.

LRUs 12B, interconnect aircraft wiring 14B and signal conditioning circuits 18B for channel #2 and #3 are identical to the corresponding circuits and components described above for channel #1. Signal conditioning circuits 18B for channels #2 and #3 develop control signals which are passed on to associated controllers of the aircraft electrical system, and each channel also produces a test signal that is applied as illustrated in FIG. 2B to the channel #2 and #3 inputs of multiplexer 22B.

The multiplexed output $V_c$ that successively represents the test voltage outputs from the various input channels is applied to a comparator circuit 24B that includes a set of three comparators 200, 202 and 204, an AND gate 206 and an OR gate 208. One input of each of comparators 200, 202 and 204 is jointly connected to receive $V_c$ from the output of multiplexer 22B, and the second inputs of the comparators are separately connected to receive predetermined reference voltage levels $V_a$, $V_b$ and $V_d$, respectively, where $V_a > V_b > V_d$. In this embodiment, $V_d$ has a negative voltage value, and the operating voltage applied to the selector via interconnect wiring 14B at circuit 18B consists of a $+V$ supply voltage applied to the upper terminal 16B′ and a $-V$ supply voltage applied to the lower terminal 16B‴.

As will be better understood from the detailed example given below of the operation of detector circuit 24B, this circuit in general functions to detect a component open failure by determining at comparators 200 and 202 that the test voltage $V_c$ is less than the highest reference voltage of $V_a$, but greater than the intermediate reference voltage $V_b$. In response to this set of conditions, AND gate 206 receives a logic high signal at inverted input 210 and also a logic high signal at the other input (not inverted) from the output 212 of comparator 202. Responsively AND gate 206 issues a logic high signal to the CO input of demultiplexer 26B.

If, on the other hand, the multiplexed voltage $V_c$ is greater than $V_a$, or $V_c$ is less than $V_d$ (a negative value), then a logic high signal at output 209 of comparator 200 or a logic high signal at output 214 of comparator 204 causes OR gate 208 to apply a logic high signal to the WO input of demultiplexer 26B representing a wire open failure.

The foregoing generally described operation of detector circuit 24B can be better understood by reference to a specific example. It is assumed that the impedance of potentiometer 150 between end terminals 154 and 156 is 1k ohms. Given this value, the shunt resistor 158 is selected to be substantially greater than the impedance of potentiometer 150 and, in particular, is set at 1 megohm. Resistors 160 and 162 are selected to be less than the resistance of potentiometer 150 and, in this case, are selected to be 0.5k ohms. In signal conditioning circuit 18B, resistors 166 and 168 of voltage divider network 164 are selected so that the impedance of resistor 166 between terminals 16B' and wiper terminal 16B'' is less than the impedance of resistor 168 between terminals 16B'' and 16B''' by approximately one order of magnitude. Thus, resistor 166 is, in this instance, selected to be 100k ohms and resistor 168 is set at 1 megohms. The supply voltage is: $+V_s = +4$ volts and $-V_s = -4$ volts.

Given these values, and assuming that the gain of scaling network 180 is one such that $V_c = V_o$, the test voltage applied to comparator network ranges from approximately $-2$ volts to $+3$ volts, depending upon the occurrence and type of fault. Circuit analysis will show that for the following conditions, the voltage $V_c$ will fall between the stated limits:

| Condition | Test Voltage Level: $V_c$ |
| --- | --- |
| Normal | $-2 < V_c < +2$ |
| Component open | $+3 > V_c > +2$ |
| Wire open | $V_c > +3$, or $V_c < -3$ |

Thus, by setting $V_a = +3$, $V_b = +2$ and $V_d = -3$, and adjusting these levels to accommodate circuit tolerances, comparators 200 and 202 together with AND gate 206 will detect a test voltage condition in which $V_c$ is less than $+3$ volts and greater than $+2$ volts, indicating a component open failure. Comparator 200 will detect a condition in which either the center lead wire 14B'' is open, or the lower lead wire 14B''' is open, which respectively cause $V_c$ to equal 3.27 volts, and 3.99 volts, both of which are over the threshold reference of $V_a = 3.0$ volts. Comparator 204 alternatively detects a condition in which the upper lead wire 14B' is open, in which case the voltage of $V_c$ approaches the $-V_s$ applied at terminal 16B''' and, in particular, will equal approximately $-3.88$ to $-3.96$ volts, and thus less than the lower limit of $V_d = -3$ volts.

Figure 2C:
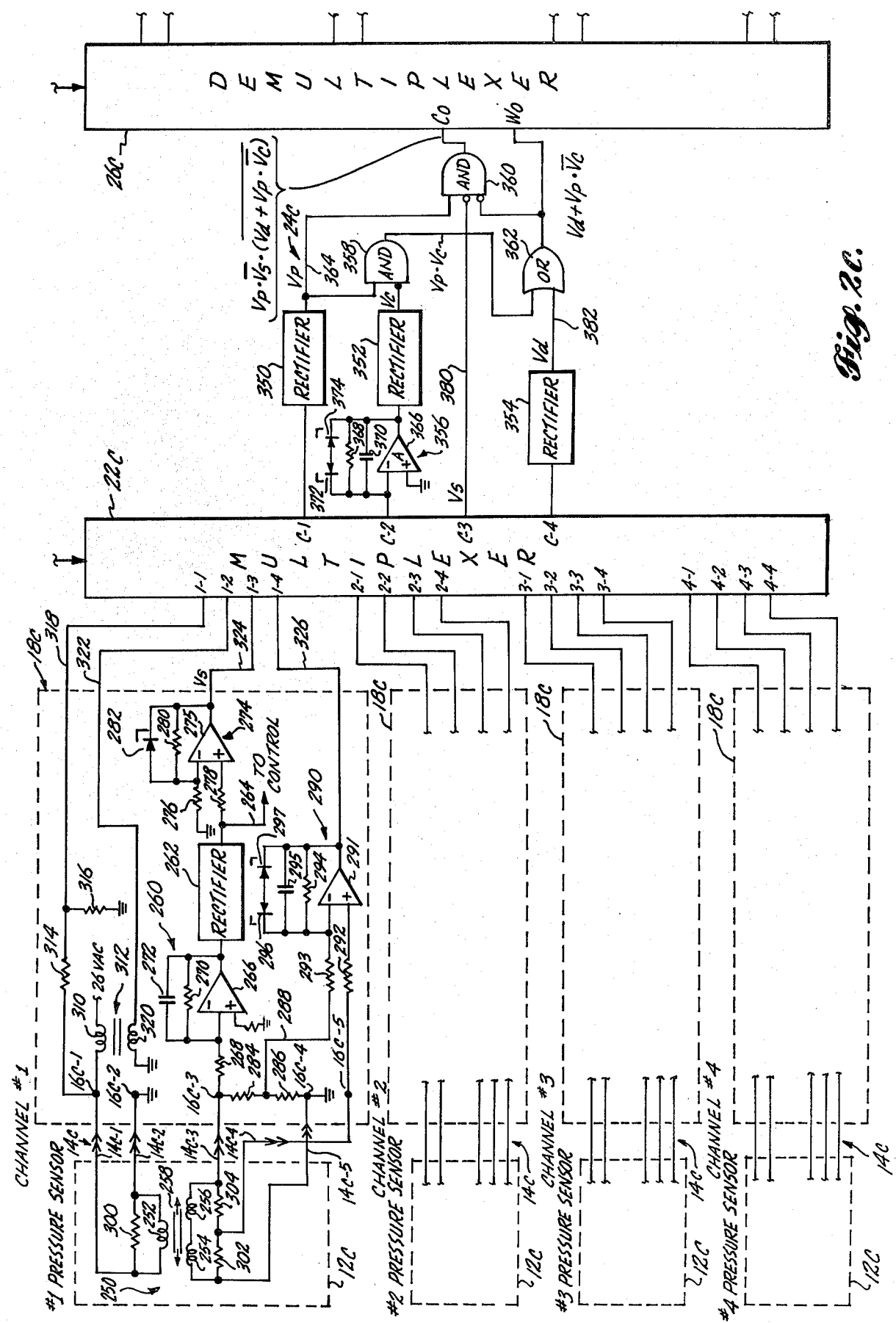

With reference to FIG. 2C, still another exemplary embodiment of the invention is illustrated in which LRU 12C for each of the plurality of channel #1-4 consists of a multiwinding, linear-variable-differential-transformer (LVDT) 250 (see channel #1) employed as a pressure sensor. LVDT pressure sensors are commonly used in various environmental monitoring and control systems of the aircraft avionics. Because an open circuit fault can occur in any one of the plurality of windings in LVDT 250, the fault monitoring circuitry is somewhat more complex than provided in the above described embodiments. Nevertheless, the principles of the invention are found in the circuit of FIG. 2C as will be evident from the following description.

In LRU 12C of channel #1, LVDT 250 has a primary winding 252, a pair of serially connected secondary windings 254 and 256 and a pressure sensitive, movable slug 258 of magnetically permeable material. As well-known to those skilled in the art, an AC signal applied to the primary winding 252 is coupled via slug 258 to secondary windings 254 and 256 which are serially connected and oppositely poled so that the secondary windings produce a differential output signal when slug 258 is displaced (in response to a change in pressure) from a dead center position. The resulting output control signal appears between grounded lead 14C-5 and lead 14C-3. Terminal 16C-3 receives the AC voltage output signal, whereupon the signal is amplified by amplifier circuit 260 and rectified by rectifier 262 of signal conditioning circuit 18C, and thence applied to output lead 264 which feeds the pressure signal to another part of the aircraft's electrical system. Circuit 260 is shown to include an operational amplifier 266, input and feedback resistors 268 and 270, respectively, and a phase compensating feedback capacitor 272.

For fault monitoring, LRU 12C includes a set of three shunt resistors connected to the windings of LVDT 250 as shown. A primary shunt resistor 300 is connected in parallel across primary winding 252, and a pair of secondary shunt resistors 302 and 304 are connected in series (with respect to each other) and then in parallel across the serially connected secondary windings 254 and 256.

Primary leads 14C-1 and 14C-2 of aircraft wiring 14C connect the shunted primary winding 252 to terminals 16C-1 and 16C-2 respectively of signal conditioning circuit 18C. Terminal 16C-1 is in turn connected to receive an AC operating voltage, which in this instance is 26 VAC, through a primary winding 310 of a current sensing transformer 312. Also, terminal 16C-1 is connected through a resistive buffering network including series resistor 314 and grounded resistor 316 to the 1-1 input of multiplexer 22C over a lead 318. A secondary 320 of sensing transformer 312 is connected between ground and an input terminal 1-2 of multiplexer 22C over another lead 322. Leads 318 and 322 provide to multiplexer 22C and hence to fault detection circuit 24C signal information representing the electrical conditions at the primary of LVDT 250.

The electrical condition of the secondary windings and associated leads is monitored by a signal derived from the control signal path which includes terminal 16C-3 by means of a buffer amplifier circuit 274 including an operational amplifier 275, input resistors 276 and 278, feedback resistor 280 and a voltage limiting Zener diode 282, also connected in feedback about amplifier 275. The resulting output signal $V_s$ is connected over lead 324 to input 1-3 of multiplexer 22C and represents the presence of an output signal at the secondary of LVDT 250. Additionally, leads 14C-3 and 14C-5 are connected to terminals 16C-3 and 16C-4 respectively, so that secondary shunt resistors 302 and 304 form a bridge circuit with resistors 284 and 286 of signal conditioning circuit 18C. The output of the thusly formed bridge network appears over lead 14C-4 that is connected between the junction of shunt resistors 302 and 304 and terminal 16C-5, and a lead 288 connected to the junction of resistors 284 and 286. The associated output signal from this bridge network is amplified by an amplifier circuit 290 including operational amplifier 291, input resistors 292 and 293, and amplifier feedback elements including resistor 294, phase compensating capacitor 295 and a pair of serially connected back-to-back Zener diodes 296 and 297. The output from amplifier circuit 290 represents an unbalanced condition of the bridge network formed by resistors 302, 304, 284 and 286 as described in greater detail below, and is fed over lead 326 to input 1-4 of multiplexer 22C.

Each of LRUs 12C and signal conditioning circuits 18C of channel #2-4 are identical to the above described circuitry for channel #1. Thus, the signals representing the electrical condition of the various LRU windings and leads of channel #2 are fed from the channel #2 signal conditioning circuit 18C to multiplexer inputs 2-1, -2, -3 and -4; and to inputs 3-1, -2, -3 and -4 for channel #3; and to inputs 4-1, -2, -3 and -4 for channel #4. In this particular embodiment, the output signals from the signal conditioning circuits 18C of the various channels are not scaled as was the case in the above described embodiments of FIGS. 2A and 2B. Rather, in the embodiment of FIG. 2C, detection circuit 24C uses logic circuits instead of comparators and responds to logic levels one or zero at the output from the signal conditioning circuits 18C, instead of scaled analog outputs as in FIGS. 2A and 2B.

The groups of four multiplexer inputs from each of channels #1-4 are sequentially connected, one group at a time, to multiplexer outputs c-1, c-2, c-3 and c-4 which in turn are connected to the inputs of the common fault detector circuit 24C. Included in circuit 24C are a set of three rectifiers 350, 352 and 354, an amplifier circuit 356, and a set of logic gates provided by a two-input AND gate 358, a three-input AND gate 360 and a two-input OR gate 362.

At the c-1 output of multiplexer 22C, an AC signal appears representing the AC voltage on lead 14C-1 feeding the primary of LVDT 250. This AC signal is rectified by rectifier 250 and the resulting DC signal, designated $V_p$, is one of several signals representing the electrical condition of the associated LRU 12C, and is connected over lead 364 to a noninverted input of the three-input AND gate 360.

The signal at output c-2 of multiplexer 22C is developed by the secondary winding 320 of current sensing transformer 312 and is first amplified by amplifier circuit 356, which includes an operational amplifier 366, a feedback resistor 368, a phase compensating capacitor 370, also connected as a feedback element, and a pair of voltage limiting back-to-back Zener diodes 372 and 374, also connected as feedback elements about amplifier 366. The amplified, phase compensated and voltage limited AC signal resulting from amplifier circuit 356 is rectified by a rectifier 352 and appears as a DC signal $V_c$ representing the presence of current in lead 14C-1 of the primary winding of LVDT 250.

Output c-3 receives $V_s$, representing the presence of an output voltage across the secondary windings 254 and 256 of LVDT 250, and $V_s$ is connected over lead 380 to an inverted input of AND gate 360.

Output c-4 receives the amplified, limited AC signal from amplifier circuit 290 of signal conditioning circuit 18C, rectifies this AC signal in rectifier 254 and produces a DC signal, $V_d$, representing an unbalanced condition of the resistive bridge associated with the secondary of LVDT 250 and described above. Normally $V_d$ is 0, representing a condition in which the bridge formed by resistors 302, 304, 284 and 286 is balanced and the input to differential amplifier circuit 290 is zero. If, however, any one of the leads 14C-3, 14C-4 or 14C-5 becomes open, the bridge is unbalanced and a difference voltage appears at the input to amplifier circuit 290 which ultimately appears as a rectified DC voltage $V_d$ on lead 382 from rectifier 354.

Logic gates 358, 360 and 362 receive the signal condition information carried by $V_p$, $V_c$, $V_s$ and $V_d$ and derive output signals representing a component open condition, CO, at the output of AND gate 360, and a wire open condition, WO, at the output of OR gate 362. In particular, AND gate 358 receives at the noninverted input, the signal $V_p$, and at the inverted input, the signal $V_c$ and thus has an output representing the logic condition $V_p \cdot \overline{V_c}$. This logic signal then passes to an input of OR gate 362 and the signal $V_d$ is applied to the other OR gate input and thus the output of OR gate 362 represents the logic condition $V_d + V_p \cdot \overline{V_c}$. AND gate 360 receives $V_p$ at the noninverted input over lead 364; receives $V_s$ at one of the inverted inputs; and receives the output of OR gate 362 at the remaining inverted input, such that the output of AND gate 360 represents the logic condition $V_p \cdot \overline{V_s} \cdot \overline{(V_d + V_p \cdot \overline{V_c})}$.

As will be apparent from the Truth Table set forth below, the various logic states of $V_p$, $V_c$, $V_s$ and $V_d$ define the particular type of fault associated with LRU 12C and the interconnected leads 14C-1, 2, 3, 4 and 5. In the Truth Table, logic high = 1 and logic low = 0. Thus:

| LRU/WIRING CONDITION | $V_p$ | $V_c$ | $V_s$ | $V_d$ | AND GATE 358 | (WO) OR GATE 362 | (CO) AND GATE 360 |
|---|---|---|---|---|---|---|---|
| Primary Leads 14C-1 or 2 Open | 1 | 0 | 0 | 0 | 1 | 1 | 0 |
| Secondary Leads 14C-3 or 5 Open | 1 | 1 | 0 | 1 | 0 | 1 | 0 |
| Primary Winding 252 Open | 1 | 1 | 0 | 0 | 0 | 0 | 1 |
| Either Sec. Winding 254, 256 Open | 1 | 1 | 0 | 0 | 0 | 0 | 1 |
| Bridge Center Wire Open | 1 | 1 | 1 | 1 | 0 | 1 | 0 |
| Normal Operation | 1 | 1 | 1 | 0 | 0 | 0 | 0 |

It is thus observed, that shunt resistor 300 across primary winding 252 enables the fault monitoring circuitry to differentiate between an open fault of winding 252 and an open fault in leads 14C-1 or 2. In the former case, the presence of an excitation voltage represented by $V_p = 1$ together with current flow in the primary circuit represented by $V_c=1$ together with the absence of a secondary output represented by $V_s=0$ defines a set of conditions that, by deduction, means a fault in the primary winding. Shunt resistors 302 and 304 enable the secondary fault monitoring circuitry to distinguish between an open fault in secondary windings 254 or 256, and an open fault in one of the secondary leads 14C-3 or 5. An open secondary winding will be associated with an operating primary represented by $V_p=1$ and $V_c=1$, but an absence of secondary voltage represented by $V_s=0$. An open secondary lead will result in an unbalancing of the bridge network formed by shunt resistors 302 and 304, and resistors 284 and 286 in signal conditioning circuit 18C, which causes $V_d=1$. In this regard, the monitoring of the secondary windings and associated leads 14C-3 and 14C-5 requires the addition of a third, auxiliary secondary lead 14C-4 which is not needed for the avionics control signal, but is added to implement the fault monitoring capability. The added lead 14C-4 does not add any unreliability to the fault detection circuit inasmuch as an open fault in lead 14C-4 is automatically detected along with the detection of open faults in the principal secondary leads 14C-3 and 14C-5 by the unbalancing of the bridge network.

Operation

While the built-in passive fault detection circuitry of the invention can be used for monitoring most of the various LRU components, it is particularly advantageous when used for detecting faults in components located within or adjacent to an engine housing. For example, the LRU components 12A' and 12A" of channel #4-5 of FIG. 2A are mounted adjacent to the engine. Each of these LRUs are repeatedly cycled between the large temperature swings associated with a cold versus hot engine. This temperature cycling together with engine vibration creates severe environmental conditions for the LRU components, and it is not uncommon for such LRUs to incur open impedance faults.

The electrical control signals for each of these LRU components is communicated, from the engine housing, back to an electrical controller usually located in the electrical/electronics bay of the aircraft. For this purpose, the aircraft interconnect wiring 14A extends from connectors located at LRUs 12A' and 12A" and joins a number of other wires to form a cable which is permanently joined to the engine housing and is removably connected to the wiring harness of the aircraft by means of a multipin connector to facilitate removal of the engine for servicing or replacement. From such connector, the aircraft wiring harness, including a succession of connectors, extends along the wing, into the fuselage and from there along the body of the fuselage into the aircraft's electrical/electronic bay (not shown). A plurality of equipment racks are located in the bay, and on one of the racks is a controller that contains the associated signal conditioning circuits 18A' and 18A". Associated with circuits 18A' and 18A" are the corresponding controllers of the bleed air system, and these controllers develop the necessary control signals for operating LRUs 12A' and 12A". Separate interconnect wires 14A' and 14A" and separate conditioning circuits 18A' and 18A" are employed for each of the associated channels #4 and #5. However, multiplexer 22A, common fault detector 24A and demultiplexer 26A may be mounted within a common controller that receives signals from a plurality of LRUs 12A, 12A' and 12A".

With reference to FIG. 1, the indicators 30 for each of the various LRU channels may be provided by any of a variety of well-known visual indicators, such as warning lights mounted on the panels of the associated rack mounted controller.

With the built-in test capability provided by the invention, faults that occur in the monitored LRUs or associated interconnect wiring will be detected, stored and indicated in the electrical/electronic equipment bay. The indicators may be checked by ground maintenance crew, either in response to a pilot complaint of a malfunction or during routine, between-flight checks of the avionics. The fault indication will identify not only the location of the fault, but also the nature of the fault, i.e., whether the fault is in the LRU or in the interconnect wiring associated therewith. This represents a significant advantage over prior built-in test equipment, particularly for those not infrequent occasions in which an intermittent, open fault has occurred in the interconnect wiring 14A. As discussed above, open wire faults such as this have been wrongly diagnosed as an open fault in the LRU component, precipitating needless replacement of the LRU, and resulting in an ineffective maintenance action.

Incorrectly diagnosed open wire faults are particularly troublesome when the monitored LRU component is joined to the equipment bay by one or more electrical connectors that are frequently disconnected and reconnected for maintenance. For example, engines are from time to time removed for maintenance or replacement, and after repeated use of the connectors, the pins and associated sockets sometimes become loose and/or damaged, resulting in both intermittent and steady open faults. The capability of the invention to distinguish between open component faults and open wire faults, particularly intermittent faults of either type, significantly improves the effectiveness and cost efficiency of maintenance actions.

Alternative Embodiment

With reference to FIGS. 3 and 4, another embodiment is shown, which implements the principles of the invention, using a digital computer. As illustrated in FIG. 3, a multiplexer 422, corresponding to multiplexer 22 of FIG. 1, receives the electrical condition signals from the plurality of LRU channels at inputs 1-5, and develops a multiplexed output at c in the same manner as described above in connection with multiplexer 22 of FIG. 1 and multiplexers 22A, B and C of FIGS. 2A, B and C, respectively. In FIG. 3, the output c of multiplexer 422 is connected over lead 424 to an analog-to-digital converter 426 where the electrical condition signal, in analog form, is converted to a digital format. A converter 426 having a parallel bit output is used, such that each sequentially multiplexed signal at input 424 presents a multibit, parallel output on leads 428. The parallel bit digitized information is received by a data processing computer 430, which may be a hard wired, special purpose computer, or a programmed general purpose computer. In either case, the computer 430 functions to process the input data according to the data flow chart shown in FIG. 4, and described more fully hereinafter. The computed fault data is fed over connection 432 where the data is presented on a display 434. The fault detection function and the demultiplexing function performed by circuits 24 and 26 in FIG. 1, are effected internally of computer 430 in accordance with the data processing shown in FIG. 4 and described below.

Now with particular reference to FIG. 4, the digital data outputted by converter 226 to computer 430 is processed as depicted by the flow chart, which uses standard symbolism to represent the flow of data through the computer. In particular, the diamond-shaped blocks represent a decision function, while the rectangular-shaped blocks represent either an instruction, register or compute function. Thus, the BITE program 450 directs the flow of data from analog-to-digital converter 426 into the computation path of the computer by accepting data for each channel at block 452 from a channel data register 454 which has previously received the multibit output from analog-to-digital converter 426. The data for each channel is hence fed from acceptance block 452 into a first decision block 456 where the digital data is compared with predetermined limits representing a value range reflecting an open fault of the associated LRU component. For example, in connection with FIG. 2A, if the digital data fed to decision block 456 represented a voltage level $V_c$, then the predetermined limits established by decision block 456 for that channel would be a digital signal representing a $V_b$ for a low limit of the range and a digital signal representing $V_a$ as the upper limit of the range. If the digital data for that channel falls within these limits, the decision in block 456 is affirmative and an instruction is issued to block 458 causing the storage of data representing a component failure for the subject channel. On the other hand, if the decision by block 456 is negative, then the data is passed serially forward to a second decision block 460. At block 460, the data is compared with a limit or limits representing a failed interconnect wiring range. In the above mentioned example, the failed wire range would have a lower limit of $V_a$, and so long as the digital data representing $V_c$ exceeded the digital data representing $V_a$, then the decision in block 460 would be affirmative. In such case, decision block 460 would issue an instruction to block 462 causing storage of data representing an open wire failure for the interconnect wiring associated with that channel.

If the decision by block 460 is negative, incidating that the interconnect wiring is good, then an instruction is issued to block 464, which in turn instructs the block 452 over flow path 466 to accept data from register 454 for the next LRU channel. Successive negative decisions by blocks 456 and 460 indicate that the subject LRU channel has neither a component open or wiring open fault.

Additionally, simultaneously with the affirmative decisions by either block 456 or 460, an instruction is issued over signal paths 468 and 470, respectively, causing block 464 to instruct block 452 to proceed to accept the next channel data so that the computation continues, in sequence, without interruption.

Fault data storage blocks 458 and 462 provide memory or component and wiring faults, and this information is fed over data path 472 to display 434. Within display 434 or associated therewith is a decision block 474 which detemines whether the display has been enabled automatically, in which case an affirmative output from block 474 causes an execute block 476 to display component or wiring failures. A negative output of decision block 474 results in no display unless a manually operated select display function 478 is actuated, in which case execute block 476 is instructed over the alternative data path 480 to display any component or wiring faults that may have been detected.

While only particular embodiments of the invention have been disclosed herein, it will be readily apparent to persons skilled in the art that numerous changes and modifications can be made thereto without departing from the spirit of the invention.

The embodiments of the invention in which an exclusive property or privilege is claimed are defined as follows:

1. In a built-in test apparatus for an aircraft's electrical/electronic system that has a plurality of LRUs each incorporating a nonswitching electrical LRU component, each of such LRU components havine an impedance within a predetermined range of finite, non-zero impedance values, and wherein the plurality of LRUs are mounted at diverse locations throughout the aircraft, and the electrical/electronic system has a plurality of electrical terminal means disposed at a central equipment bay and LRU-to-terminal interconnect wiring extending between said terminal means and associated LRUs for communicating non-test electrical control signals between individual terminal means and the associated LRU component, wherein the improvement in the built-in test apparatus comprises:

a plurality of passive test shunts each of which is permanently connected across an associated one of said plurality of LRU components so as to be physically part of the corresponding LRU and thus removable and replaceable as a unit with the associated LRU component, said test shunts each having an impedance selected to lie between a predetermined minimum and a predetermined maximum, said predetermined minimum impedance being substantially equal to or greater than the lowest impedance value of said predetermined range of values of the associated LRU component, and said predetermined maximum impedance being substantially less than a predetermined open wire impedance of the associated interconnect wiring so that an application of an associated one of said non-test electrical control signals to such associated LRU component over the interconnect wiring causes a first predetermined electrical condition at the associated terminal means when such LRU component and associated shunt and associated interconnect wiring are in an unfailed state, and causes a second predetermined electrical condition when such LRU component is in a failed open state and the associated interconnect wiring is in an unfailed state, and causes a third predetermined electrical condition when the associated interconnect wiring is in a failed open state;

fault detector means for detecting and distinguishing between said first, second and third predetermined electrical conditions at each of said terminal means, said detector means having first, second and third discrete electrical states, respectively representing unfailed states of one of said components and of its associated shunt and interconnect wiring, a failed open state of one of said components, and a failed open state of the associated interconnect wiring; and coupling means for coupling said plurality of terminal means to said fault detector means so as to detect said electrical conditions at each of said terminal means.

2. In the built-in test apparatus of claim 1, wherein said interconnect wiring associated with each said LRU includes at least one connector means for disconnecting and reconnecting said interconnect wiring to said LRU component and its associated test shunt.

3. In a built-in test apparatus of claim 1, wherein said fault detector means comprises a common detection circuit that is common to said plurality of LRU components and associated test shunts and interconnect wiring, and wherein said means for coupling comprises:
 a plurality of normalization circuit means, a different one of which is associated with each separate said LRU component, each said normalization circuit means having an input coupled to the terminal means of the associated LRU component and an output at which a normalized fault indicating electrical condition is produced in response to an unnormalized electrical condition at such terminal means; and
 multiplexing means for sequentially and cyclically coupling said outputs of said plurality of normalization circuit means to said common detection circuit so as to sequentially monitor said electrical conditions at each of said terminal means.

4. In the built-in test apparatus of claim 3, wherein the improvement further comprises electrical condition storage means for individually storing a detected fault condition represented by either of said second or third electrical states of said detector means for each of said LRU components and associated interconnect wiring, and further comprising demultiplexing means for operating in synchronization with said multiplexing means and for sequentially and cyclically coupling said detection circuit to said electrical storage means so as to receive and store each occurrence of said second electrical state or third electrical state of said detector means for each said LRU component and its associated interconnect wiring.

5. In the built-in test apparatus of claim 1, wherein at least one of said LRU components comprises an impedance element having a variable impedance value that varies in a continuous manner within said predetermined range in response to an independently varying environmental condition on the aircraft.

6. In the built-in test apparatus of claim 1, wherein at least certain said interconnect wiring includes at least one connector of the pin and socket type, whereby such connector when fatigued by repeated use is prone to intermittent open faults.

7. An aircraft electrical/electronic system having a built-in test apparatus, comprising in combination:
 a plurality of nonswitching electrical LRU components mounted at diverse locations throughout the aircraft, each of said LRU components having a non-zero impedance lying within a predetermined range of finite impedance values;
 a plurality of electrical terminal means disposed at a central equipment bay;
 LRU component-to-terminal interconnect wiring extending between said terminal means and associated ones of the LRU components of communicating non-test electrical control signals between individual terminal means and the associated LRU component;
 a plurality of passive test shunts each of which is permanently connected across a separate, associated one of said plurality of LRU components, said test shunts each having an impedance selected to lie between a predetermined minimum and a predetermined maximum, said predetermined minimum impedance being substantially equal to or greater than the lowest impedance value of said predetermined range of values of the associated LRU component, and said predetermined maximum impedance being substantially less than a predetermined open wire impedance of the associated interconnect wiring so that an application of an associated one of said non-test electrical control signals to such associated LRU component over the interconnect wiring causes a first predetermined electrical condition at the associated terminal means when such LRU component and associated shunt and associated interconnect wiring are in an unfailed state, and causes a second predetermined electrical condition when such LRU component is in a failed open state and the associated interconnect wiring is in an unfailed state, and causes a third predetermined electrical condition when the associated interconnect wiring is in a failed open state;
 common fault detector means for detecting failed open states of each of said components and of the associated interconnect wiring, said detector means having first, second and third discrete electrical states, respectively representing an unfailed state of one of said components and of its associated shunt and interconnect wiring, a failed open state of such one of said components, and a failed open state of the associated interconnect wiring; and
 means for sequentially coupling said terminal means to said common fault detector means so as to successively monitor the electrical conditions at each of said terminal means, said means for sequentially coupling including a plurality of normalization circuit means, a different one of which is associated with each separate said LRU component, each said normalization circuit means having an input coupled to the terminal means of the associated LRU component and an output at which a normalized fault indicating electrical condition is produced in response to the electrical condition at such terminal means, said common fault detector means assuming said first state in response to the presence of said first, predetermined electrical condition at one of said terminal means, and assuming said second state in response to the occurrence of the second predetermined electrical condition at one of said terminal means, and assuming said third state in response to the occurrence of the third predetermined electrical condition at one of said terminal means.

8. In the built-in test apparatus of claim 7, wherein the improvement further comprises electrical condition storage means for individually storing a detected fault condition represented by either of said second or third electrical states of said detector means for each of said LRU components and associated interconnect wiring, and further comprising demultiplexing means for operating in synchronization with said multiplexing means and for sequentially and cyclically coupling said detection circuit to said electrical storage means so as to receive and store each occurrence of said second electrical state or third electrical state of said detector means for each said LRU component and its associated interconnect wiring.

9. In the built-in test apparatus of claim 7, wherein at least one of said LRU components comprises an impedance element having a variable impedance value that varies in a continuous manner within said predetermined range in response to an independently varying environmental condition on the aircraft.

* * * * *

UNITED STATES PATENT AND TRADEMARK OFFICE
CERTIFICATE OF CORRECTION

PATENT NO. : 4,414,539

DATED : November 8, 1983

INVENTOR(S) : James P. Armer

It is certified that error appears in the above-identified patent and that said Letters Patent is hereby corrected as shown below:

Column 16, line 33, "$V_p \cdot V_c$" should be --$V_p \cdot \overline{V_c}$--

Column 16, line 36, "$V_d + V_p \cdot V_c$" should be --$V_d + V_p \cdot \overline{V_c}$--

Column 16, line 41, "$V_p \cdot V_s \cdot (V_d + V_p \cdot V_c)$" should be --$V_p \cdot \overline{V_s} \cdot \overline{(V_d + V_p \cdot \overline{V_c})}$--

Signed and Sealed this

Thirteenth Day of March 1984

[SEAL]

Attest:

GERALD J. MOSSINGHOFF

*Attesting Officer*     *Commissioner of Patents and Trademarks*